(12) United States Patent
Lenz et al.

(10) Patent No.: US 7,928,775 B2
(45) Date of Patent: Apr. 19, 2011

(54) HIGH-SIDE SWITCH ARRANGEMENT

(75) Inventors: Michael Lenz, Zorneding (DE); Daniel Bolohan, Bucharest (RO); Alexandru Simion, Bucharest (RO)

(73) Assignee: Infineon Technologies AG, Neubiberg (DE)

( * ) Notice: Subject to any disclaimer, the term of this patent is extended or adjusted under 35 U.S.C. 154(b) by 161 days.

(21) Appl. No.: 12/481,606

(22) Filed: Jun. 10, 2009

(65) Prior Publication Data

US 2009/0309632 A1    Dec. 17, 2009

(30) Foreign Application Priority Data

Jun. 12, 2008 (DE) .................. 10 2008 027 998

(51) Int. Cl.
*H03B 1/00* (2006.01)
*H03K 3/00* (2006.01)
(52) U.S. Cl. ....................... 327/108; 324/522
(58) Field of Classification Search .......... 327/108; 324/522

See application file for complete search history.

(56) References Cited

U.S. PATENT DOCUMENTS

| 5,119,263 A * | 6/1992 | Gariboldi et al. ............ 361/18 |
| 6,437,607 B1 | 8/2002 | Milanesi |
| 6,879,133 B1 * | 4/2005 | Geren ....................... 320/134 |

FOREIGN PATENT DOCUMENTS

| DE | 102005010337 A1 | 3/2005 |
| EP | 743529 A1 | 5/1995 |

* cited by examiner

*Primary Examiner* — Lincoln Donovan
*Assistant Examiner* — Daniel Rojas

(57) ABSTRACT

High-side switch arrangement having a switching transistor, the collector of which is connected to a battery connection of the high-side switch arrangement and the emitter of which is connected to an output connection of the high-side switch arrangement, an actuating transistor, the emitter of which is connected to the battery connection of the high-side switch arrangement and the collector of which is connected to the base of the switching transistor, and a diagnosis transistor, the emitter of which is connected to the battery connection of the high-side switch arrangement and the collector of which is connected to the output connection of the high-side switch arrangement, wherein the diagnosis transistor has a saturation collector for sensing the saturation current of the diagnosis transistor.

9 Claims, 1 Drawing Sheet

HIGH-SIDE SWITCH ARRANGEMENT

FIELD OF THE INVENTION

The present invention relates to a high-side switch arrangement having a diagnosis apparatus for identifying a fault state in the high-side switch arrangement.

BACKGROUND

In circuit breakers, the state of the switch is often determined for diagnosis purposes. Important states of a switch are the low-load situation, the normal situation or the overload situation. These situations can be determined by measuring the current through the switch. If the supply line is interrupted, the low-load situation or open-load situation obtains. If the low-load situation and the overload situation are determined by measuring currents in the switch, it is necessary for the current thresholds for the low-load situation and the overload situation to be as far apart as possible so that the states can be explicitly determined.

Circuit breakers can be used as high-side switches, low-side switches or motor bridge drivers. In a motor bridge with a rated current of 1 A, currents in the switch above 1.5 A can be interpreted as an overload and currents below 10 mA can be interrupted as a low load. A large ratio for the rated current to the rated low-load current or for the rated current to the rated overload current often requires not inconsiderable circuit complexity. A low-load detector uses suitable measures to ascertain the current through the load. If there is an interruption in the load path or if the load resistance is too high, a diagnosis apparatus should identify this state. When the low-load state has been identified, a diagnosis circuit outputs a low-load situation signal. In the case of high-side switches using bipolar technology, for example in an NPN-PNP Darlington arrangement, ascertaining the low-load situation requires a high level of circuit complexity.

A known solution for diagnosing the low-load situation in a bipolar high-side switch is a resistor in series with the high-side switch. The voltage produced as a result of the current through this resistor is compared with a reference voltage using a comparator, and if it is below the reference voltage then this indicates the low-load situation. The additional voltage drop across the resistor is troublesome, since it increases the resistance of the high-side switch to a corresponding degree.

To sense the low-load situation, it is often necessary to sense small currents via the high-side switch. Sensing small currents results in the need for relatively large resistors to be used, since the voltage drop across the resistor needs to be large enough for disturbing influences on the comparator, such as the offset voltage in the comparator, not to be dominant. Since the comparator is part of the high-side switch, the comparator experiences the same voltage swing as the high-side switch. The high voltage swing means that the comparator needs to have a high level of common-mode rejection. The high common-mode rejection means a high level of circuit complexity.

Another known option is a current mirror circuit. Current mirror circuits are technically complex and sensitive towards temperature influences.

Another known option is a low-side switch having two NMOS transistors of different size, the smaller NMOS transistor being provided with a source resistor. If the current through the low-side switch is below a predetermined threshold, the open-load situation is identified. The split of the low-side switch allows small currents to be measured without significantly impairing the switched-on resistance of the low-side switch.

Another known option is a high-side switch having two NMOS transistors of different size, the small NMOS transistor carrying a reference current. The reference current value is used to define the open-load situation for the high-side switch. The reference current value is set taking account of the area ratios of the NMOS transistors of different size.

Another known option is a PNP transistor as a load transistor having a measurement zone for sensing the saturation current of the PNP transistor and having an evaluation apparatus.

SUMMARY OF THE INVENTION

An implementation of the present invention is based provides a low-load identification using little circuit complexity. This is achieved by a high-side switch arrangement having the features of Claim 1. The dependent claims respectively define additional implementations of the present invention.

The high-side switch arrangement comprises a switching transistor, the collector of which is connected to a battery connection of the high-side switch arrangement and the emitter of which is connected to an output connection of the high-side switch arrangement, an actuating transistor, the emitter of which is connected to the battery connection of the high-side switch arrangement and the collector of which is connected to the base of the switching transistor, a diagnosis transistor, the emitter of which is connected to the battery connection of the high-side switch arrangement and the collector of which is connected to the output connection of the high-side switch arrangement, wherein the diagnosis transistor has a saturation collector for sensing the saturation current of the diagnosis transistor.

If an attempt is made to evaluate the saturation current of the actuating transistor directly, a wide spread and a relatively large load current, for which no further saturation current arises, are obtained.

The high-side switch arrangement can have a diagnosis apparatus having an input, the input being connected to the saturation collector of the diagnosis transistor, and the diagnosis apparatus possibly having a diagnosis output.

The switching transistor in the high-side switch arrangement may be an NPN transistor.

The high-side switch arrangement may contain a resistor connected between the base and the emitter of the switching transistor. Such a resistor has the particular advantage that the switching transistor remains safely off at high temperatures, when leakage currents can flow from PN junctions into the base.

The actuating transistor in the high-side switch arrangement may be a PNP transistor.

The actuating transistor in the high-side switch arrangement may have a saturation collector, which may be connected to the base of the actuating transistor. The saturation collector of the actuating transistor can be used to effectively reduce the parasitic saturation currents.

The diagnosis transistor in the high-side switch arrangement may be a PNP transistor. The fact of the actuating transistor and the diagnosis transistor both being in the form of PNP transistors results in the advantage that the threshold for the saturation current, which indicates a low-load situation, can be set easily and precisely. A particular advantage is obtained if the actuating transistor and the diagnosis transistor have the same design, or the same transistor type.

The diagnosis apparatus in the high-side switch arrangement may have a current source which is connected to the saturation collector of the diagnosis transistor.

The switching transistor in the high-side switch arrangement may be in the form of a Darlington NPN transistor arrangement.

The collector current of the actuating transistor can be limited using a saturation collector, which is connected to the base of the actuating transistor, in the case of a high-impedance load. A saturation collector of a lateral PNP transistor is an additional collector which is formed around or on the basic structure of the lateral PNP transistor. A resistor connected between the base and the emitter of the switching transistor prevents the NPN switching transistor from switching on in this case. This makes use of the effect that the lateral PNP transistor driving the NPN transistor is driven to saturation when the load current is too low. Charge carriers which flow into the base zone, e.g. the epitaxial layer in the case of a lateral PNP transistor, of a lateral PNP transistor when the transistor is saturated can be picked up by means of known lateral structures. This additional collector collects the charge carriers which would flow into the base zone of the PNP transistor when the transistor is saturated. Depending on the embodiment of the saturation collector, it is possible to prevent the charge carriers from flowing into the base zone of the transistor almost completely. A saturation collector may be in the form of a strip, or, as a ring, may comprise the PNP transistor either partly or completely.

BRIEF DESCRIPTION OF THE DRAWINGS

Embodiments are explained in more detail below with reference to the following drawings.

DETAILED DESCRIPTION

Figure 1:
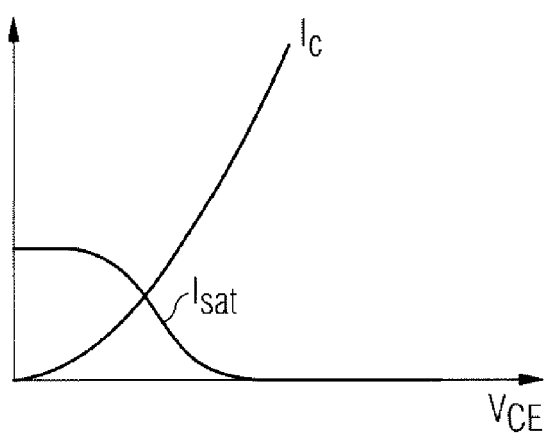
FIG. 1 shows a characteristic curve for a PNP transistor.

FIG. 1 shows an example of the typical response of a PNP transistor with a saturation collector (a further P region beside or outside the useful collector). It is possible to see that the saturation current disappears as the emitter/collector voltage VCE rises.

Figure 2:
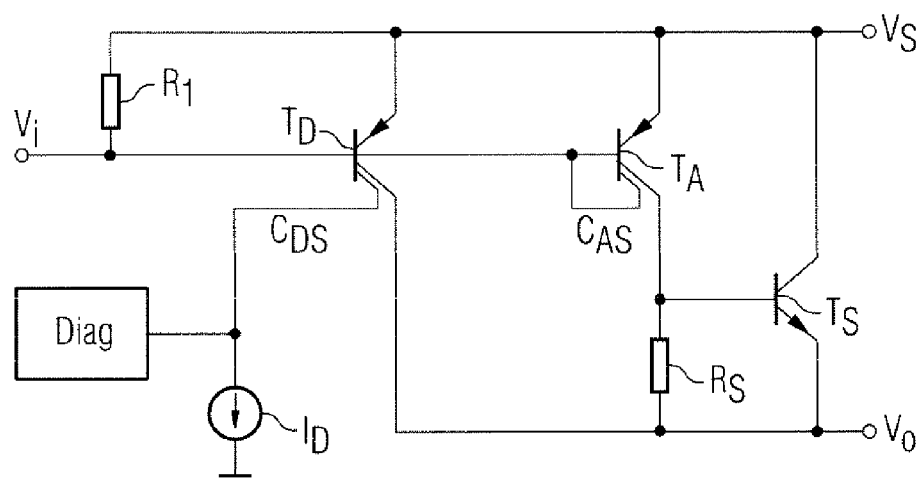
FIG. 2 shows an exemplary embodiment of a high-side switch arrangement.

A circuit as shown in FIG. 2 can be used to adjust the low-load current threshold with the current rating and the saturation current to be expected for the diagnosis transistor Td. The collector of the diagnosis transistor Td is connected to the output connection Vo of the high-side switch arrangement and not to the base of the switching transistor Ts, like the collector of the actuating transistor Ta. If the output current from the high-side switch arrangement is increased, the diagnosis transistor Td is the first transistor which leaves the state of saturation. The saturation current in the saturation collector of the diagnosis transistor Td decreases. The actuating transistor Ta, for which only a low emitter/collector voltage is applied on account of the series resistor Rs, remains in the state of saturation.

Figure 3:
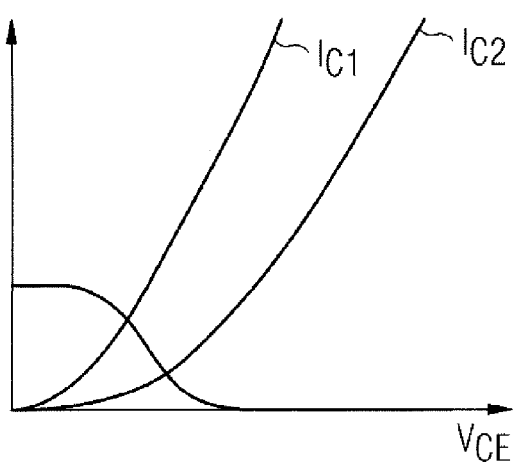
FIG. 3 shows two characteristic curves for the PNP transistors Ta, Td.

As FIG. 3 shows, the current in the saturation collector of the diagnosis transistor Td drops below the threshold of an evaluation circuit Diag when the switch voltage between the battery connection and the output connection of the high-side switch arrangement is greater than the voltage at which the diagnosis transistor Td leaves the state of saturation.

The actuating transistor Ta may be much larger than the diagnosis transistor Td. Larger also means that more transistor basic cells are used, for example. The value of the resistor Rs may be so low that the switching transistor Ts does not switch on for small currents in the actuating transistor Ta. In this case, primarily the diagnosis transistor Td delivers a current to the output connection Vo of the high-side switch arrangement at very small switch voltages. When the switch voltage rises, the actuating transistor Ta also starts to deliver a current to the output connection of the high-side switch arrangement. The current in the actuating transistor Ta flows via the resistor Rs to the output connection Vo of the high-side switch arrangement. For voltage drops below 200 mV, the switching transistor Ts remains safely off.

The current in the saturation collector of the diagnosis transistor Td falls continuously as the output current rises and the switch voltage is constant, until the current is below the threshold of the evaluation circuit Id, Diag. The switch voltage may typically be 150 to 200 mV, and the emitter/collector voltage of the actuating transistor Ta may typically be 50 mV.

For higher load currents, the voltage across the resistor Rs of the switching transistor Ts switches on the switching transistor Ts. The high-side switch arrangement then operates what is known as a quasi PNP transistor, that is to say that a PNP transistor actuates an NPN transistor as a driver.

The exemplary embodiment of the high-side switch arrangement in FIG. 2 is in the form of a pseudo PNP Darlington stage. A switching transistor Ts is in the form of NPN transistor, with the collector of the switching transistor Ts being connected to a battery connection Vs of the high-side switch arrangement. The emitter of the switching transistor Ts is connected to an output connection Vo. The base of the switching transistor Ts is connected to a collector of the actuating transistor Ta for the purpose of actuation. The base and the emitter of the switching transistor Ts are connected to a resistor Rs. The output connection Vo may have a load connected to it. The switching transistor Ts is designed to connect a load to the battery connection Vs. The switching transistor Ts is in a form such that, in the normal operating situation of the high-side switch arrangement, it connects the largest current component, in comparison with the actuating transistor Ta and the diagnosis transistor Td, from the battery connection Vs to the load via the output connection Vo. The resistor Rs is in the form such that the switching transistor Ts cannot carry a current if the collector of the actuating transistor Ta is providing only a small current. The resistor Rs thus prevents the switching transistor Ts from being switched on unintentionally, as may occur as a result of leakage currents at high temperatures, for example.

The emitter of the actuating transistor Ta is connected to the battery connection Vs of the high-side switch arrangement. The base of the actuating transistor Ta is connected to the actuating connection Vi. The base and the emitter of the actuating transistor Ta may be connected to an input resistor R1. This input resistor is designed to prevent unintentional flow of current in the actuating transistor Ta. The actuating connection Vi can be used to actuate the high-side switch arrangement like a PNP transistor. When a current is taken from the actuating connection Vi, the actuating transistor Ta is thus actuated. This current is amplified by means of the current gain of the actuating transistor Ta and is supplied to the base of the switching transistor Ts via the collector of said actuating transistor. The high-side switch arrangement is therefore actuated and the switching transistor supplies current to the load.

When the output connection Vo has no load or only a high-impedance load connected to it, the switching transistor Ts is unable to conduct current. Since the collector current of the actuating transistor Ta cannot flow either or can flow via the resistor Rs only to a minimal degree, the voltage drop between the battery connection Vs and the output connection Vo at the high-side switch arrangement becomes minimal. The collector/emitter voltage of the actuating transistor Ta also becomes minimal, and the actuating transistor Ta enters saturation. If the actuating transistor is in the form of a lateral PNP transistor, a very large parasitic saturation current flows into the substrate of the semiconductor circuit.

The saturation collector of the actuating transistor can be connected to the base of the actuating transistor. When the saturation collector is connected to the base of the transistor, the saturation current compensates for the base current of the transistor. When the transistor is saturated, such a connection effectively prevents excessively great actuation of the transistor and a large parasitic saturation current entering the substrate.

The emitter of the diagnosis transistor Td, a lateral PNP transistor, is connected to the battery connection Vs of the high-side switch arrangement. The collector of the diagnosis transistor Td is connected to the output connection of the high-side switch arrangement. The base of the diagnosis transistor Td is connected to the actuating connection Vi of the high-side switch arrangement. The diagnosis transistor Td is therefore actuated in parallel with the actuating transistor Ta. The collector of the diagnosis transistor Td is directly connected to the output connection Vo of the high-side switch arrangement, and the transistor therefore always has a higher collector/emitter voltage than the actuating transistor Ta, the collector of which is connected to the output connection Vo via a resistor Rs and via the switching transistor Ts. The diagnosis transistor Td therefore enters saturation only at a lower voltage between the battery connection Vs and the output connection Vo.

Since the diagnosis transistor Td is connected directly to the output connection Vo of the high-side switch arrangement, it can also supply a current to the load. That is to say that a high-impedance load can be safely supplied with current, even though the actuating transistor Ta is saturated and the switching transistor Ts is not on.

The lateral PNP diagnosis transistor Td has a saturation collector. If the load is of such high impedance, or is not present, that the collector current of the diagnosis transistor Td is also too large for the high-impedance load, the diagnosis transistor Td enters saturation. Once the diagnosis transistor Td is saturated, a current flows through the saturation collector into a diagnosis apparatus Id, Diag. The diagnosis apparatus Id, Diag may have a current source Id and a comparator Diag, for example. In the exemplary embodiment in FIG. 2, the diagnosis apparatus has a current source Id and an evaluation apparatus Diag. The saturation current of the diagnosis transistor Td is compared with a particular current from the current source Id. If the saturation current of the diagnosis transistor Td is larger than the current from the current source Id, the diagnosis apparatus Diag generates a signal which indicates the absence of a load.

Since the saturation current of the diagnosis transistor Td does not have any effect on the high-side switch arrangement per se, there are large degrees of freedom for the design of the saturation collector of the diagnosis transistor Td, since it is not absolutely necessary for the entire saturation current to be sensed, for example. The saturation collector of the diagnosis transistor Td may be in the form of a simple region, in the form of a strip or in the form of a partially or completely encompassing ring. It is advantageous if the diagnosis transistor Td and the actuating transistor Ta are of the same transistor type. The diagnosis transistor Td and the actuating transistor Ta may differ in their emitter multiplicity. The switching transistor Ts, the actuating transistor Ta and the diagnosis transistor Td may be designed from a plurality of individual transistors. If the diagnosis transistor Td is designed from a plurality of individual lateral PNP transistors, it may be sufficient for just one transistor element of the diagnosis transistor Td to be designed with a saturation collector.

The diagnosis apparatus DIAG which compares the current Id with the saturation current of the diagnosis transistor Td may be in the form of a simple comparator or in the form of a Schmitt trigger. The second connection of the current source Id may be an arbitrary reference-earth potential for the rest of a circuit, for example earth. The current source properties of the current source Id and of the saturation collector of the diagnosis transistor Td allow the diagnosis to be decoupled from the high-side switch arrangement.

FIG. 3 shows the collector currents of the actuating transistor Ta and of the diagnosis transistor Td and the saturation current of the diagnosis transistor Td as a function of the voltage Vso between the battery connection Vs and the output connection Vo. As FIG. 2 shows, the current in the saturation collector of the diagnosis transistor Td drops below a particular threshold when the collector/emitter voltage of the diagnosis transistor Td exceeds the saturation voltage.

If the actuating transistor Ta is chosen to be much larger than the diagnosis transistor Td and at the same time the resistor Rs has a low value such that the switching transistor Ts still remains off, only the diagnosis transistor Td delivers a current to the output connection Vo at very low voltages across the high-side switch arrangement. From a somewhat higher voltage, the actuating transistor Ta also starts to conduct current, while the switching transistor Ts remains off. The current in the actuating transistor Ta is smaller than the current in the diagnosis transistor Td. However, this current flows via the resistor Rs into the output connection Vo. With voltage drops below 200 mV, the switching transistor Ts remains safely off.

The saturation current in the saturation collector of the diagnosis transistor Td decreases continuously as the output current rises, until it is below a threshold.

In this case, the collector/emitter voltage of the diagnosis transistor Td is approximately 150 to 200 mV, and the collector/emitter voltage of the actuating transistor Ta is approximately 50 mV.

In contrast to conventional high-side switch arrangements which ascertain the load current using current mirror circuits, for example, and divide it down in particular ratios, the high-side switch arrangement according to the invention forces a flow of current through the diagnosis transistor Td and the actuating transistor Ta, and the switching transistor Ts remains off.

At higher load currents, the voltage drop across the resistor Rs switches on the switching transistor Ts. The high-side switch arrangement then operates as what is known as a quasi PNP transistor.

The invention claimed is:
1. A high-side switch arrangement comprising:
   a switching transistor, the collector of which is connected to a battery connection of the high-side switch arrangement and the emitter of which is connected to an output connection of the high-side switch arrangement;
   an actuating transistor, the emitter of which is connected to the battery connection of the high-side switch arrangement and the collector of which is connected to the base of the switching transistor; and a diagnosis transistor, the emitter of which is connected to the battery connection of the high-side switch arrangement and the collector of which is connected to the output connection of the high-side switch arrangement; wherein the diagnosis transistor has a saturation collector for sensing the saturation current of the diagnosis transistor.

2. The high-side switch arrangement according to claim 1, having a diagnosis apparatus having an input, wherein the input of the diagnosis apparatus is connected to the saturation collector of the diagnosis transistor and wherein the diagnosis apparatus has a diagnosis output.

3. The high-side switch arrangement according to claim 1, wherein the switching transistor is an NPN transistor.

4. The high-side switch arrangement according to claim 1, wherein a resistor is connected between the base and the emitter of the switching transistor.

5. The high-side switch arrangement according to claim 1, wherein the actuating transistor is a PNP transistor.

6. The high-side switch arrangement according claim 1, wherein a saturation collector of the actuating transistor is connected to the base of the actuating transistor.

7. The high-side switch arrangement according to claim 1, wherein the diagnosis transistor is a PNP transistor.

8. The high-side switch arrangement according to claim 1, wherein the diagnosis apparatus has a current source which is connected to the saturation collector of the diagnosis transistor.

9. The high-side switch arrangement according to claim 1, wherein the switching transistor is in the form of a Darlington NPN transistor arrangement.

* * * * *